(12) United States Patent
Storbeck et al.

(10) Patent No.: US 7,094,637 B2
(45) Date of Patent: Aug. 22, 2006

(54) METHOD FOR MINIMIZING THE VAPOR DEPOSITION OF TUNGSTEN OXIDE DURING THE SELECTIVE SIDE WALL OXIDATION OF TUNGSTEN-SILICON GATES

(75) Inventors: Olaf Storbeck, Dresden (DE); Wilhelm Kegel, Langebrück (DE); Jens-Uwe Sachse, Dresden (DE); Michael Stadtmüller, Dresden (DE); Regina Hayn, Baernsdorf (DE); Erwin Schoer, Dresden (DE); Georg Roters, Dülmen (DE); Steffen Frigge, Chemnitz (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/694,593

(22) Filed: Oct. 27, 2003

(65) Prior Publication Data

US 2004/0121569 A1   Jun. 24, 2004

Related U.S. Application Data

(63) Continuation of application No. PCT/DE02/01321, filed on Apr. 10, 2002.

(30) Foreign Application Priority Data

Apr. 26, 2001   (DE) ............................... 101 20 523

(51) Int. Cl.
*H01L 21/337* (2006.01)
(52) U.S. Cl. ...................... 438/192; 438/592; 438/773; 257/E23.145

(58) Field of Classification Search ................ 438/192, 438/592, 773; 257/E23.145
See application file for complete search history.

(56) References Cited

U.S. PATENT DOCUMENTS

| | | | |
|---|---|---|---|
| 6,162,741 A | 12/2000 | Akasaka et al. | |
| 6,165,883 A | 12/2000 | Hiura | |
| 6,228,752 B1 | 5/2001 | Miyano | |

FOREIGN PATENT DOCUMENTS

| | | |
|---|---|---|
| EP | 0 116 317 A2 | 8/1984 |
| EP | 0 849 777 A2 | 6/1998 |
| JP | 11031666 | 2/1999 |
| WO | 01/17021 A1 | 3/2001 |

OTHER PUBLICATIONS

Wolf and Tauber; Silicon Processing for the VLSI Era vol. 1: Process Technology; pp. 57, 208 and 209; 1986, Lattice Press; Sunset Beach, CA.*

* cited by examiner

*Primary Examiner*—Matthew Smith
*Assistant Examiner*—Fernando L. Toledo
(74) *Attorney, Agent, or Firm*—Laurence A. Greenberg; Werner H. Stemer; Ralph E. Locher

(57) ABSTRACT

During a selective oxidation of gate structures that includes a polycrystalline silicon layer and a tungsten layer, which is known per se, a vapor deposition of tungsten oxide is prevented or at least greatly reduced by a special process. The gate structure is acted on by a hydrogen-containing, nonaqueous inert gas before and, if appropriate, after a treatment step with a hydrogen/water mixture.

21 Claims, 3 Drawing Sheets

METHOD FOR MINIMIZING THE VAPOR DEPOSITION OF TUNGSTEN OXIDE DURING THE SELECTIVE SIDE WALL OXIDATION OF TUNGSTEN-SILICON GATES

CROSS-REFERENCE TO RELATED APPLICATION

This application is a continuation of copending International Application No. PCT/DE02/01321, filed Apr. 10, 2002, which designated the United States and was not published in English.

BACKGROUND OF THE INVENTION

FIELD OF THE INVENTION

The invention relates in general terms to the field of fabrication of metallization structures, in particular gate structures, which include at least one layer of polycrystalline silicon and at least one tungsten layer. The invention relates in particular to a selective oxidation method for a metallization structure of this type. More specifically, the invention relates to a method for the selective oxidation of a polycrystalline silicon layer without oxidizing the tungsten layer. The metallization structure is acted on by a mixture of hydrogen and water in a treatment step in which heat is supplied.

As part of the ongoing reduction in the size of MOS transistors, tungsten is increasingly being used as a constituent of the gate stack. Tungsten has considerable advantages as a gate material compared to tungsten silicide, which is likewise already in widespread use. The lower resistivity of tungsten compared to tungsten silicide makes it possible to reduce the resistance of the gate and thereby achieve improved electrical properties of the transistors. On account of the lower resistivity, it is also possible to significantly reduce the height of the layered gate stack, with the result that the various filling and etching steps are considerably simplified, since the aspect ratio (ratio of the height of gates to the distance between adjacent gates) is reduced.

During the fabrication of the multilayer gate stack, first it is usual for a gate oxide layer, a polycrystalline silicon layer, a tungsten nitride layer, a tungsten layer and a silicon nitride layer to be applied to a silicon substrate. Then, individual gate regions, that are intended to be located in each case above a channel of a MOS transistor, are defined by photolithography and vertical etching. To electrically insulate the etched side walls of the gate stacks and to anneal etching damage, suitable insulation layers have to be applied to the side walls. An $SiO_2$ layer, which is produced by thermal oxidation, is most suitable for the polycrystalline silicon layer. At the same time, however, it is necessary to prevent oxidation of the tungsten layer, since experience has shown that the oxidation is not restricted to the surface, but also continues in the lateral direction in the layer and thereby produces high-impedance tungsten oxide, with the result that the electrical functionality of the gate is impeded.

Various methods for producing sidewalls of a gate electrode that includes a tungsten layer have become known.

U.S. Pat. No. 6,165,883 describes a method that is based on selective oxidation of the gate stack. The method is explained in more detail below with reference to FIGS. 1A to 1C in the drawing.

A gate oxide layer 1 is formed on a silicon substrate 10 by thermal oxidation, and then a polycrystalline silicon layer 2, a barrier layer 3 of tungsten nitride or titanium nitride, a tungsten layer 4 and a silicon nitride layer 5 are deposited on the gate oxide layer 1. Then, the silicon nitride layer 5 is patterned in order to define the gate regions, so that the structure shown in FIG. 1A is obtained for a gate region. The mesa-etched structure 5 of the silicon nitride layer subsequently serves as an etching mask. Then, in a vertical etching step, the layers 1 to 4 are removed in the regions between the gate structures, so that only individual, defined gate regions of the layer stack remain in position. Next, selective oxidation in an atmosphere containing water and hydrogen is carried out at 800° C., with silicon oxide layers 6 being formed only on the silicon substrate 10 and at the side walls of the polycrystalline silicon layer 2. By contrast, the tungsten layer 4 is not oxidized. The structure which is thereby obtained is illustrated in FIG. 1B. Finally, a silicon nitride layer 7 is applied as an insulating layer to the side walls of the silicon nitride layer 5, of the tungsten layer 4, of the tungsten nitride layer 3 and of the silicon oxide layer 6. As a result, the gate structure is now surrounded on all sides by electrically insulating side walls. For the sake of simplicity, the following process steps, which are explained in the above-mentioned document, will not be considered in further detail in the present document.

To carry out the selective oxidation, it is important for a defined mixing ratio of the hydrogen/water mixture to be established in the region chamber. The pressure ratio of $H_2O/H_2$ that is set at the flow controllers of the reaction chamber, i.e. the corresponding concentration ratio that is set in the reaction chamber, is plotted against the process temperature in FIG. 2. FIG. 2 shows reaction equilibrium curves, on which defined oxidation reactions are in equilibrium with the associated reduction reactions. The oxidation or reduction of tungsten is illustrated by the upper equilibrium curve, while the oxidation or reduction of silicon is characterized by the lower equilibrium curve. In both cases, starting from the respective equilibrium curve, a rise in the water vapor content and/or a fall in the process temperature lead/leads to equilibrium being lost in favor of the corresponding oxidation reaction. It is important for the process conditions wafer temperature and mixing ratio to be set in such a way that the operating point in the diagram shown in FIG. 2 lies in the central region between the equilibrium curves illustrated.

However, for selective oxidation, which is carried out in accordance with FIG. 1B with a view to forming the silicon oxide layers 6 by wet oxidation in a hydrogen-rich atmosphere, hitherto, there has still been considerable formation of tungsten oxide in the atmosphere which surrounds the gate region.

The tungsten oxide is volatile at the process temperatures and is deposited on the walls of the process chamber, where it is reduced to form metallic tungsten by the hydrogen. Since these deposits of tungsten, in the case of lamp-heated rapid thermal processing (RTP) installations, which are preferably used for selective oxidation, are therefore located on the quartz parts between the lamps and the wafer and, on account of their optical properties partially absorb the lamp radiation, they have a very considerable influence on the temperature homogeneity of the wafer and drastically impair this homogeneity. In addition, tungsten deposits may also be formed on the quartz parts in front of the pyrometers and may thereby have an adverse effect on the optical measurement of the wafer temperature. During processing under production conditions, i.e. repeated processing with the same process on large numbers of production wafers, the increasing deposition of tungsten leads to such rapid degradation of the layer thickness homogeneity above the wafer and from wafer to wafer that the process is not currently sufficiently stable for production applications.

Moreover, the loss of tungsten caused by the vapor deposition of tungsten oxide may cause damage to the electrical functionality of the interconnects. Furthermore, the redeposition of tungsten oxide, followed by reduction to form tungsten, may lead to the formation of undesirable conductive compounds and therefore to short-circuiting of components on the wafer. These problems are not restricted to lamp-heated RTP installations, but rather occur in all conditioning installations that can be used for selective oxidation, for example including conventional furnaces. In the latter case, however, the deposition of tungsten oxide on the chamber walls and the subsequent reduction of the tungsten oxide to form tungsten does not constitute such a serious problem.

SUMMARY OF THE INVENTION

It is accordingly an object of the invention to provide a method for minimizing the vapor deposition of tungsten oxide during the selective side wall oxidation of tungsten-silicon gates that overcomes the above-mentioned disadvantages of the prior art methods of this general type, in which method vapor deposition of tungsten oxide from the atmosphere surrounding the metallization structure does not occur at all or occurs only to a greatly reduced extent.

With the foregoing and other objects in view there is provided, in accordance with the invention, a method for selectively oxidizing a metallization structure having at least one silicon layer to be oxidized and at least one tungsten layer that is not to be oxidized. In the method, a treatment step is performed which includes subjecting the metallization structure to a mixture of hydrogen and water and supplying heat. In addition, the metallization structure is subjected to a nonaqueous hydrogen-containing substance, before and, optionally, after the treatment step.

The present invention describes an improved procedure for the selective oxidation of a metallization structure that includes at least one polycrystalline silicon layer and at least one tungsten layer. The metallization structure is acted on by a mixture of hydrogen and water in a manner which is known per se in a treatment step in which heat is supplied and, during this step, being selectively oxidized. A significant aspect of the procedure according to the invention is that the metallization structure is acted on by a nonaqueous hydrogen-containing substance, in particular pure hydrogen or a hydrogen/inert gas mixture, before and, if appropriate, after the treatment step. As tests have shown, this measure makes it possible to considerably reduce the vapor deposition of tungsten oxide, and in some cases even to eliminate it altogether. In this context, it is advantageous, although not absolutely imperative, for hydrogen or the hydrogen/inert gas mixture also to be applied after the treatment step. By way of example, the hydrogen/inert gas mixture may be a hydrogen/nitrogen mixture.

The temperature that prevails at or in the immediate vicinity of the metallization structure that is to be treated is referred to in the text that follows as the wafer temperature. During the treatment step with the hydrogen/water mixture, the supply of heat is used to set a wafer temperature, which is referred to below as the process temperature.

The extent to which the vapor deposition of the tungsten oxide can be reduced is dependent on the implementation of further measures, such as the setting of the defined wafer temperatures, rise and fall times (ramp times) for the wafer temperature and the hydrogen/water concentration ratio.

For example, it is advantageous if, during a first section of a treatment with the hydrogen-containing substance before the treatment step with the hydrogen/water mixture, the supply of heat is set in such a way that the wafer temperature is increased from a first temperature to a second temperature, the first temperature preferably lying in a range between room temperature and 200° C., and the second temperature preferably also lying in a range between 700° C. and 900° C. In this case, it is possible for the wafer temperature initially to be kept constant at the first temperature and then to be increased continuously or in steps to the second temperature.

A further advantageous measure of the method consists in, during a section of the treatment step with the hydrogen/water mixture, setting of the supply of heat in such a way that the wafer temperature is increased from a defined temperature to a process temperature. In this case, it is possible for the wafer temperature initially to be kept constant at the defined temperature and then to be increased continuously or in steps to the process temperature. The defined temperature may be formed by the above-mentioned second temperature, which lies in a range between 700° C. and 900° C., and the process temperature may be formed by a third temperature, which lies in a range between 900° C. and 1100° C.

Irrespective of the method measure described in the previous section, it has proven advantageous for the wafer temperature during the treatment step with the hydrogen/water mixture to be set to a process temperature in a range between 900° C. and 1100° C.

Furthermore, during a second section of the treatment with the hydrogen-containing substance after the treatment step with the hydrogen/water mixture, the supply of heat may be set in such a way that the wafer temperature is reduced continuously or in steps from the process temperature to a lower temperature. The process temperature may in this case be formed by the above-mentioned third temperature, which lies in a range between 900° C. and 1100° C., and the lower temperature may be a temperature which lies below the above-mentioned second temperature and therefore lies in a range between 300° C.–600° C.

Before and, if appropriate, after the application of the hydrogen-containing substance, it is also possible to carry out a treatment with an inert gas, in particular pure nitrogen.

It should be ensured that, during the treatment step with the hydrogen/water mixture, at least a state in the vicinity of a reaction equilibrium between an oxidation reaction and a reduction reaction is adopted. Preferably, however, the water content in the hydrogen/water mixture supplied and the process temperature are selected in such a manner that in the pair of reaction equations

the reaction equation $$WO_3 + 3H_2 \rightarrow W + 3H_2O$$

has a greater, in particular much greater reaction rate.

Furthermore, it has proven advantageous if the water content in the hydrogen/water mixture is below 20% for the duration of the treatment section and, at the same time, a process temperature is selected in such a manner that the above conditions with regard to the chemical reactions are maintained.

In principle, the method according to the invention can be carried out in any conditioning installation which includes a reaction chamber which has an inlet opening and an outlet opening, it being possible for substrates which include the metallization structures to be disposed in the reaction chamber in such a manner that process gases can flow past the substrates from the inlet opening to the outlet opening.

The method may, for example, be carried out in a lamp-heated rapid thermal processing (RTP) installation. The installation has a reaction chamber with an inlet opening in which the process gases can be supplied in a controlled manner to the reaction chamber, for example by mass flow controllers. The process gases flow past the silicon wafers to an outlet opening, through which they can be sucked back out of the reaction chamber by a vacuum or a pump. The wafer is heated by being irradiated with a high-power lamp.

However, the method may also be employed in a conventional furnace installation, such as for example a vertical or horizontal tubular furnace.

Particularly good results are achieved if all the additional measures which have been described above in connection with the wafer temperature and the temperature ramps are carried out. However, it is also possible to dispense with some of these measures if the improvements that they are able to bring about no longer justify the expense of executing these measures.

It has been found that the vapor deposition of tungsten oxide is reduced very considerably by the newly developed procedure and therefore, in particular in lamp-heated RTP installations, there are no deposits that impair operation of the installation, and consequently the process stability can be considerably increased. When the selective oxidation is carried out in conventional furnace installations, the method according to the invention avoids harmful deposits of tungsten oxide on the semiconductor wafer itself and the structures formed thereon.

Other features which are considered as characteristic for the invention are set forth in the appended claims.

Although the invention is illustrated and described herein as embodied in a method for minimizing the vapor deposition of tungsten oxide during the selective side wall oxidation of tungsten-silicon gates, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
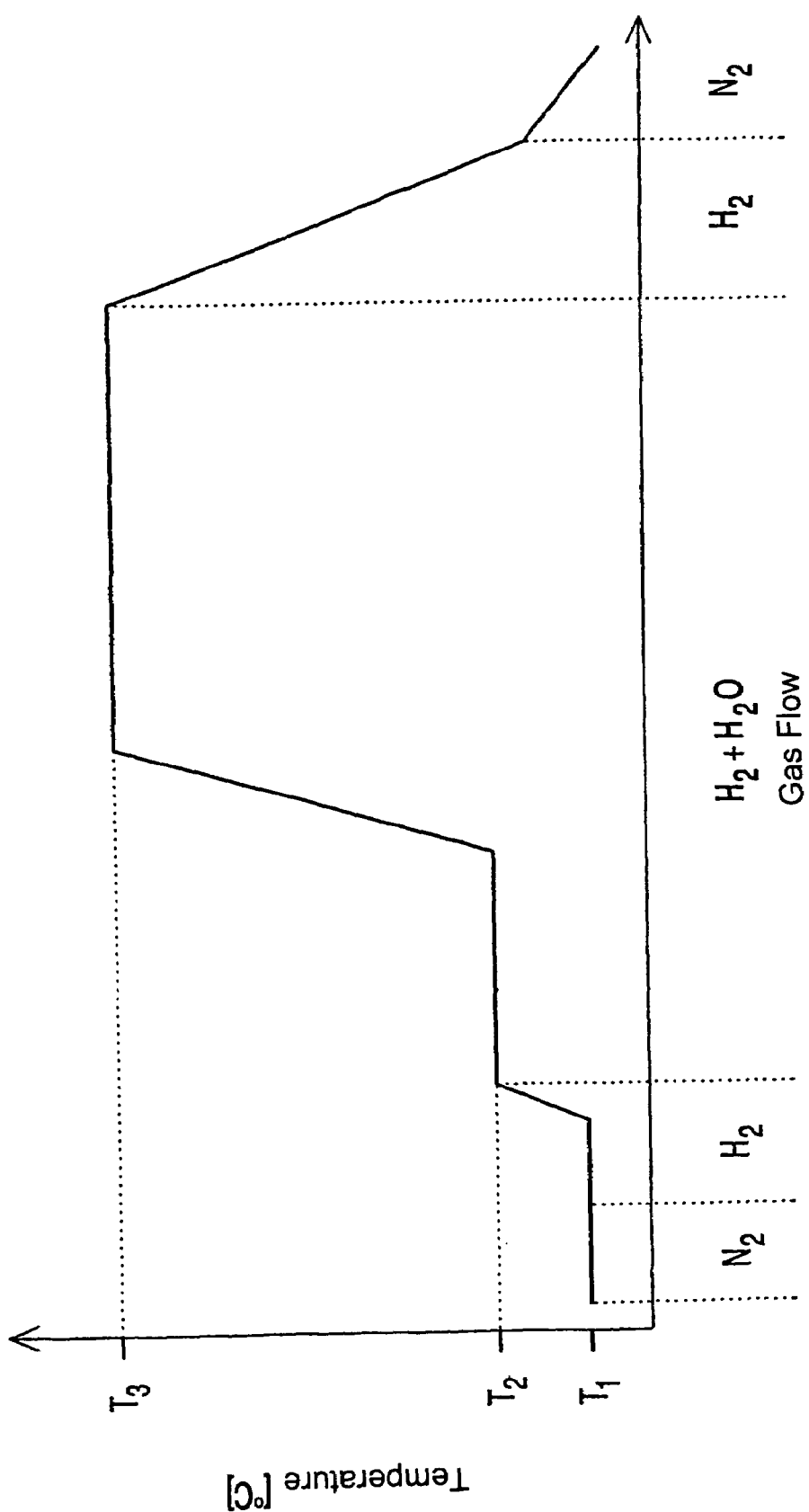
FIG. 3 is a graph showing a preferred procedure for the method according to the invention.

Referring now to the figures of the drawing in detail and first, particularly, to FIG. 3 thereof, there is shown an example of a procedure in which a treatment with pure hydrogen gas ($H_2$) is carried out immediately before and after the water/hydrogen gas mixture has been supplied.

The wafer temperature plotted on the ordinate is not linear.

First, at a very low first temperature $T_1$, for example 50° C. (the actual temperature cannot be determined by conventional pyrometer measurement), nitrogen is passed through the reaction chamber, in order to remove oxygen from the reaction chamber. The first temperature $T_1$ may lie in the range between room temperature and 200° C.

This is followed by a treatment with pure hydrogen gas. Therefore, hydrogen gas is supplied through the inlet opening of the reaction chamber, initially at a constant first temperature $T_1$, and during the ongoing hydrogen treatment the temperature is continuously increased over a ramp to the second temperature $T_2$ of, for example, 800° C.

Figure 1A:
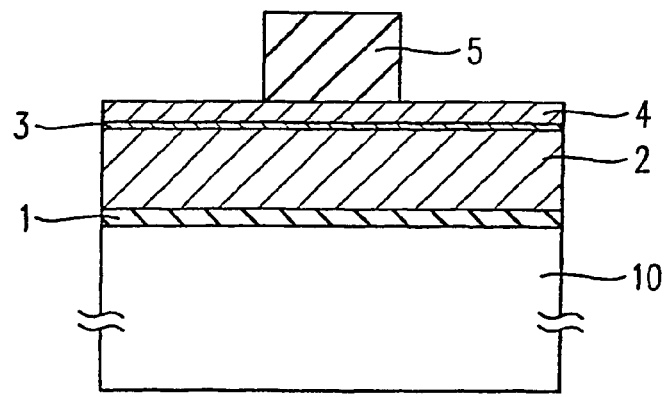
FIGS. 1A–1C are diagrammatic, sectional views showing individual method steps for a gate structure according to the prior art which includes a tungsten layer.
Figure 1B:
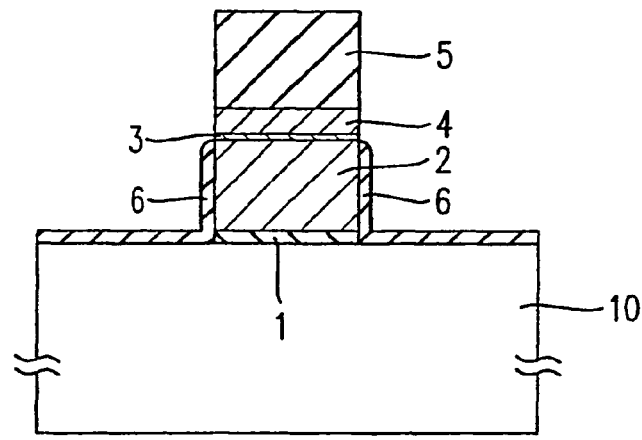
Figure 1C:
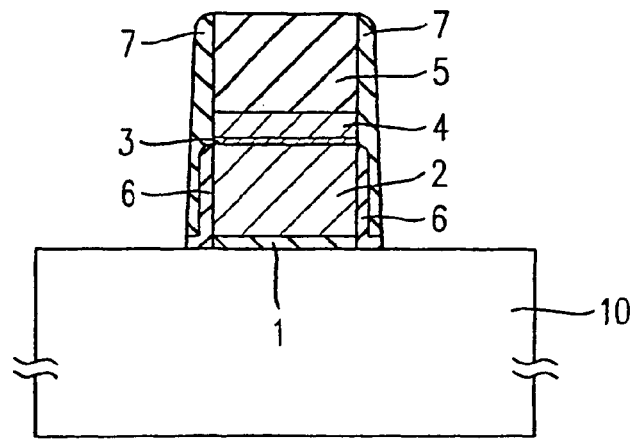
Figure 2:
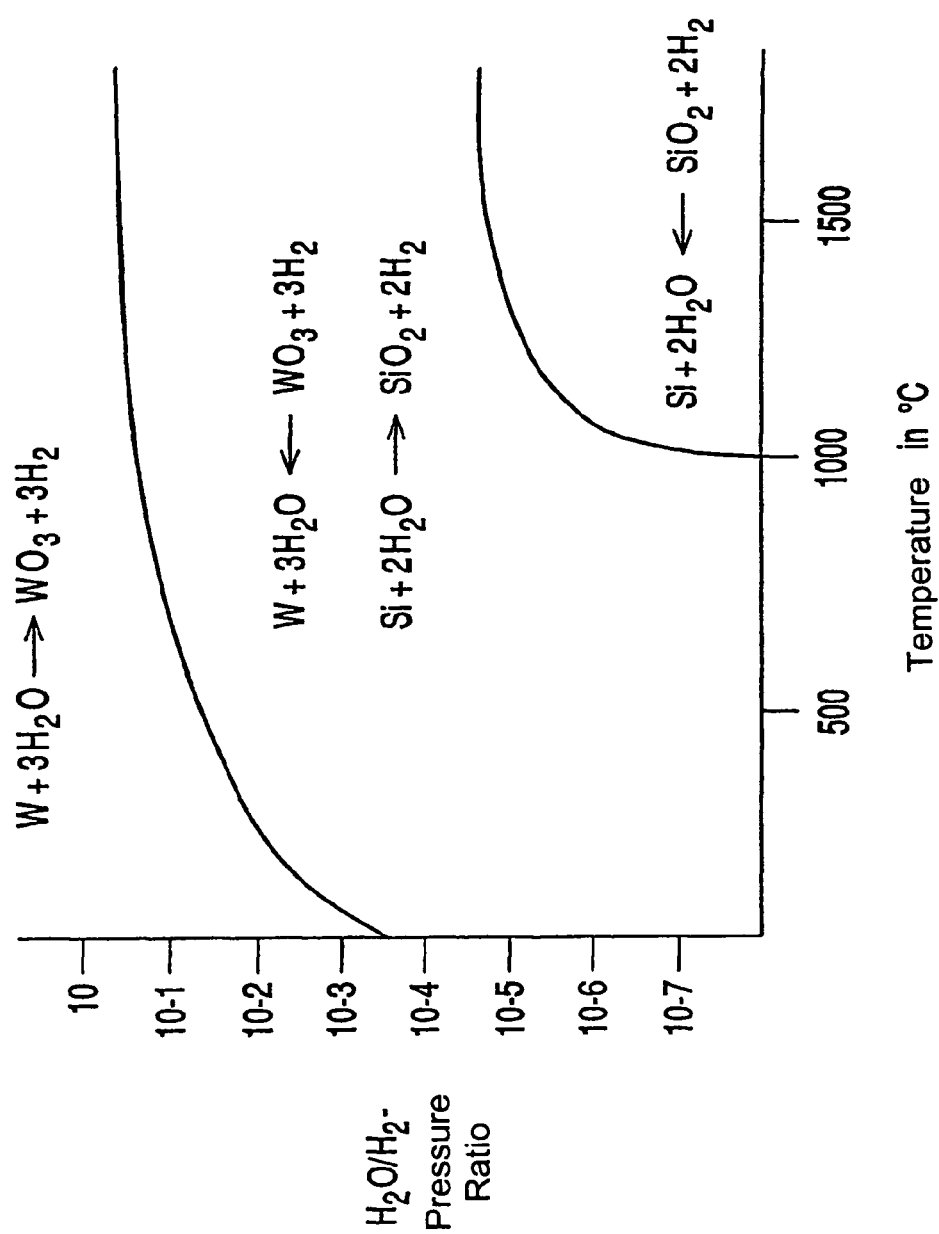
FIG. 2 is a graph illustrating reaction mechanisms and equilibria.

Then, a hydrogen/water mixture is fed to the reaction chamber, it being possible for the flow controllers to be set in such a way that an atmosphere with a water content of, for example, 14% by volume is established in the reaction chamber. The process temperature is initially kept constant at the second temperature $T_2$ of 800° C., but is then increased continuously, over a second temperature ramp, to the third temperature $T_3$ of, for example, 1050° C. At the third temperature $T_3$ (the process temperature), the treatment with the hydrogen/water mixture is carried out in the manner described above, with an $SiO_2$ layer being formed on the side walls of the polycrystalline silicon layer 2 and, if appropriate, on the silicon substrate 10 (see FIG. 1B).

This is followed by a further treatment with pure hydrogen gas, during which the wafer temperature is continuously reduced from the third temperature $T_3$ to a temperature that is lower than the second temperature $T_2$. After the treatment, nitrogen flows through the reaction chamber once again, and during this period the wafer temperature is reduced to a discharge temperature. A different inert gas may also be used instead of nitrogen.

A hydrogen/nitrogen mixture may also be used instead of the treatment with pure hydrogen gas immediately before and after the treatment with the hydrogen/water mixture. Other inert gas mixtures that contain hydrogen are also conceivable.

As an alternative to the continuous temperature ramps that are illustrated, it is also possible for the temperature to be changed discontinuously, in steps.

The process time for the treatment with the hydrogen/water mixture is typically 30–60 seconds, while the temperature ramp times are, for example, in the range from 10–50° C./s. Other times may also be used, depending on the choice of the other process parameters, in particular of the temperature and of the water content.

We claim:

1. A method for selectively oxidizing a metallization structure having at least one silicon layer to be oxidized and at least one tungsten layer which is not to be oxidized, which comprises the steps of:
   performing a treatment step which includes subjecting the metallization structure to a mixture of hydrogen and water and supplying heat; and subjecting the metallization structure to a nonagueous hydrogen-containing substance, before and after the treatment step.

2. The method according to claim 1, which further comprises during a first section of treatment with the nonagueous hydrogen-containing substance before the treatment step, setting a supply of the heat such that a temperature of the metallization structure is increased from a first temperature to a second temperature.

3. The method according to claim 2, which further comprises during the treatment step, setting a supply of the heat such that a temperature of the metallization structure is increased from the second temperature to a third temperature.

4. The method according to claim 3, which further comprises during a second section of the treatment with the nonaqueous hydrogen-containing substance after performance of the treatment step, setting the supply of the heat such that the temperature of the metallization structure is reduced continuously from the third temperature to the first temperature.

5. The method according to claim 1, which further comprises setting a water content of the mixture to be below 20% for a duration of the treatment step.

6. The method according to claim 2, which further comprises setting the first temperature to be higher than room temperature and lower than 200° C.

7. The method according to claim 2, which further comprises setting the second temperature to lie in a range from 700° C.–900° C.

8. The method according to claim 1, which further comprises at least during one section of the treatment step, setting a supply of the heat such that a temperature at or in an immediate vicinity of the metallization structure is in a range from 9000° C.–1100° C.

9. The method according to claim 1, which further comprises treating the metallization structure with an inert gas before and, optionally, after it has been subjected to the nonagueous hydrogen-containing substance.

10. The method according to claim 1, which further comprises during the treatment step, selecting a water content and a temperature such that in a pair of reaction equations

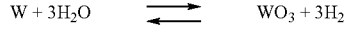

the reaction equation

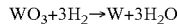

has a greater reaction rate.

11. The method according to claim 1, which further comprises:
carrying out the performing and subjecting steps in a reaction chamber which has an inlet opening and an outlet opening; and
disposing a substrate which includes the metallization structure in the reaction chamber such that process gases can flow past the substrate from the inlet opening to the outlet opening.

12. The method according to claim 1, which further comprises carrying out the subjecting and performing steps in a conditioning device.

13. The method according to claim 1, which further comprises carrying out the subjecting and performing steps in a conditioning device selected from the group consisting of a lamp-heated rapid thermal processing device and a rapid thermal annealing device.

14. The method according to claim 1, which further comprises selecting one of pure hydrogen and a hydrogen/inert gas mixture as the nonaqueous hydrogen-containing substance.

15. The method according to claim 2, which further comprises during the treatment step, setting a supply of the heat such that a temperature of the metallization structure is increased from a defined temperature to a process temperature.

16. The method according to claim 15, which further comprises during a second section of the treatment with the nonaqueous hydrogen-containing substance after performance of the treatment step, setting the supply of the heat such that the temperature of the metallization structure is reduced continuously from the process temperature to a lower temperature.

17. The method according to claim 1, wherein the metallization structure is a gate structure and the silicon layer is in polycrystalline form.

18. A method for fabricating a metallization structure having at least one silicon layer and at least one tungsten layer by carrying out the selective oxidation method according to claim 1.

19. The method according to claim 18, wherein the metallization structure is a gate structure of a MOS component and the silicon layer is in polycrystalline form.

20. A method for selectively oxidizing a metallization structure having at least one silicon layer to be oxidized and at least one tungsten layer which is not to be oxidized, which comprises the steps of:
performing a hydrogen/water treatment step which includes subjecting the metallization structure to a mixture of hydrogen and water throughout the whole hydrogen/water treatment step and supplying heat;
subjecting the metallization structure to a nonaqueous hydrogen-containing substance, before and, optionally, after the hydrogen/water treatment step; and
during the hydrogen/water treatment step, setting a supply of the heat such that a temperature of the metallization structure is increased from a defined temperature to a process temperature.

21. A method for selectively oxidiang a metallization structure having at least one silicon layer to be oxidized and at least one tungsten layer which is not to be oxidized, which comprises the steps of:
performing a hydrogen/water treatment step which includes subjecting the metallization structure to a mixture of hydrogen and water throughout the whole hydrogen/water treatment step and supplying heat; and
subjecting the metallization structure to a nonaqueous hydrogen-containing substance, immediately before and, optionally, after the hydrogen/water treatment step.

* * * * *